(12) United States Patent
Atobe

(10) Patent No.: US 9,465,691 B2
(45) Date of Patent: Oct. 11, 2016

(54) READ REQUEST PROCESSING APPARATUS

(75) Inventor: Hiroshi Atobe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 117 days.

(21) Appl. No.: 14/388,049

(22) PCT Filed: Jun. 28, 2012

(86) PCT No.: PCT/JP2012/066494
§ 371 (c)(1),
(2), (4) Date: Sep. 25, 2014

(87) PCT Pub. No.: WO2014/002222
PCT Pub. Date: Jan. 3, 2014

(65) Prior Publication Data
US 2015/0046773 A1    Feb. 12, 2015

(51) Int. Cl.
*G11C 29/00* (2006.01)
*G06F 11/10* (2006.01)
*G11C 29/02* (2006.01)
*G06F 3/06* (2006.01)

(52) U.S. Cl.
CPC ............ *G06F 11/1016* (2013.01); *G06F 3/06* (2013.01); *G06F 11/106* (2013.01); *G06F 11/1044* (2013.01); *G11C 29/02* (2013.01)

(58) Field of Classification Search
None
See application file for complete search history.

(56) References Cited

U.S. PATENT DOCUMENTS 5,265,218 A * 11/1993 Testa ................... G06F 13/4243
710/100
5,560,000 A *  9/1996 Vogley ..................... G06F 1/10
711/167

(Continued)

FOREIGN PATENT DOCUMENTS

| JP | 6 119255 | 4/1994 |
| JP | 6 282449 | 10/1994 |
| JP | 11 98462 | 4/1999 |

(Continued)

OTHER PUBLICATIONS

International Search Report Issued Aug. 7, 2012 in PCT/JP12/066494 Filed Jun. 28, 2012.

*Primary Examiner* — Daniel McMahon
(74) *Attorney, Agent, or Firm* — Oblon, McClelland, Maier & Neustadt, L.L.P

(57) ABSTRACT

A wrapping burst read determination unit determines whether or not a read request is a request of a wrapping read. If the read request is the request of the wrapping read, a memory address conversion unit extracts a plurality of addresses that includes an address in which payload data requested by the read request is stored, and designates a read out order of data from the plurality of addresses extracted. If the read request is the request of the wrapping read, a first data holding unit inputs first data read out from an address to which a forefront position in the read out order has been designated among the plurality of addresses, and stores the first data. If the read request is the request of the wrapping read, a data alignment unit, inputs trailing data read out from an address to which an end position in the read out order has been designated, and extracts payload data and an ECC which are correlated with each other from the first data and the trailing data.

6 Claims, 13 Drawing Sheets

(56) References Cited

U.S. PATENT DOCUMENTS

| | | | |
|---|---|---|---|
| 6,212,596 B1* | 4/2001 | Vogley | G06F 13/4243 365/230.08 |
| 6,295,596 B1 | 9/2001 | Hirabayashi et al. | |
| 7,307,635 B1* | 12/2007 | Yang | G09G 5/37 345/560 |
| 7,899,957 B1* | 3/2011 | Dhanoa | G06F 5/00 710/22 |
| 2006/0077746 A1* | 4/2006 | Sivero | G11C 8/10 365/230.06 |
| 2008/0034132 A1 | 2/2008 | Nakatake | |

FOREIGN PATENT DOCUMENTS

| | | |
|---|---|---|
| JP | 2003 50748 | 2/2003 |
| JP | 2004 38705 | 2/2004 |
| JP | 2008 59565 | 3/2008 |
| WO | 98 01806 | 1/1998 |

* cited by examiner

Fig. 1
BACKGROUND ART

| address | 3 | 2 | 1 | 0 |
|---|---|---|---|---|
| 0000h | D3 | D2 | D1 | D0 |
| 0004h | D7 | D6 | D5 | D4 |
| 0008h | Db | Da | D9 | D8 |
| 000Ch | Df | De | Dd | Dc |
| 0010h | D13 | D12 | D11 | D10 |
| 0014h | D17 | D16 | D15 | D14 |
| 0018h | D1b | D1a | D19 | D18 |
| 001Ch | D1f | D1e | D1d | D1c |
| 0020h | D23 | D22 | D21 | D20 |
| 0024h | D27 | D26 | D25 | D24 |
| 0028h | D1b | D2a | D29 | D28 |
| 002Ch | D2f | D2e | D2d | D2c |
| 0030h | D33 | D32 | D31 | D30 |
| 0034h | D37 | D36 | D35 | D34 |
| 0038h | D3b | D3a | D39 | D38 |
| 003Ch | D3f | D3e | D3d | D3c |

Fig. 2
BACKGROUND ART

| address | 3 | 2 | 1 | 0 |
|---|---|---|---|---|
| 0000h | D3 | D2 | D1 | D0 |
| 0004h | D6 | D5 | D4 | ECC0 |
| 0008h | D9 | D8 | ECC1 | D7 |
| 000Ch | Dc | ECC2 | Db | Da |
| 0010h | ECC3 | Df | De | Dd |
| 0014h | D13 | D12 | D11 | D10 |
| 0018h | D16 | D15 | D14 | ECC4 |
| 001Ch | D19 | D18 | ECC5 | D17 |
| 0020h | D1c | ECC6 | D1b | D1a |
| 0024h | ECC7 | D1f | D1e | D1d |
| 0028h | D23 | D22 | D21 | D20 |
| 002Ch | D26 | D25 | D24 | ECC8 |
| 0030h | D29 | D28 | ECC9 | D27 |
| 0034h | D2c | ECCa | D2b | D2a |
| 0038h | ECCb | D2f | D2e | D2d |
| 003Ch | D33 | D32 | D31 | D30 |
| 0040h | D36 | D35 | D34 | ECCd |
| 0044h | D39 | D38 | ECCe | D37 |
| 0048h | D3c | ECCf | D3b | D3a |
| 004Ch | ECC10 | D3f | D3e | D3d |

READ REQUEST PROCESSING APPARATUS

TECHNICAL FIELD

The present invention relates to a technology which processes a read request that requests read out of payload data from a memory.

BACKGROUND ART

To improve reliability of a memory, an ECC (Error Correcting Code) or a parity bit may be added to payload data.

Usually, a memory element is added in a width direction (a horizontal ECC, a horizontal parity) exclusively for the ECC added or the parity bit added.

For example, it is assumed that an irregular memory with an X9 bit configuration is used instead of a memory with an X8 bit configuration.

However, in most cases, an addition of a memory element or using of the irregular memory is disadvantageous in cost and has a problem with availability of parts.

As one of solutions, a vertical ECC or a vertical parity may be used, in which the ECC is stored in a depth direction instead of the width direction so as to avoid memories from being added in the width direction.

Hereinafter, an explanation will be given with the vertical ECC as an example, but the following explanation is also applicable to the vertical parity.

For example, assume that the ECC is added to a memory configuration as shown in FIG. 1 according to a vertical ECC method.

In FIG. 1, four pieces of payload data, each having a data width of 1 byte, are stored in one address.

In a memory configuration of FIG. 1, when one byte of the ECC is added for every four bytes of payload data according to the vertical ECC, an arrangement of data becomes as shown in FIG. 2.

When a wrapping read is performed on the memory that uses the vertical ECC, data of an address that is read first from the memory (first data) is used twice, at a first read and a final read when including the ECC.

The wrapping read is a method of returning data when reading in a line size amount in a read fill operation of a cache and so on, in which processing of setting a leading address required to be accessed first, incrementing the address from the leading address and wrapping around to a lower address after reaching a wrapping boundary are performed.

In the example of FIG. 1, a unit of the wrapping read is a section of every four addresses (for example, four addresses of address 0000h, address 0004h, address 0008h, and address 000Ch).

In an example of FIG. 2, the unit of the wrapping read is provided at every five addresses (for example, five addresses of the address 0000h, the address 0004h, the address 0008h, the address 000Ch, and address 0010h).

In the example of FIG. 2, for example, when the address 0004h is set as the leading address, data of the address 0004h (ECC0 to D6), data of the address 0008h (D7 to D9), data of the address 000Ch (Da to Dc), and data of the address 0010h (Dd to ECC3) are read out.

Then, upon reaching the wrapping boundary at the address 0010h, wrapping around to the lower address is performed, and data of the address 0000h (D0 to D3) are read out.

Since the ECC of the data of the address 0000h (D0 to D3) exists at the address 0004h as "ECC0", the data of the address 0004h (ECC0 to D6) needs to be read out again.

When the wrapping read is performed on the memory that uses the vertical ECC, the data of the address that is read first from the memory (the first data) are read out twice, at the first read and the final read when including the ECC.

In most cases, a memory access involves an overhead (for example, in DRAM (Dynamic Random Access Memory), a period of inaccessibility is generated when the same bank is ACTed), reading the first data twice is inefficient and results in a performance loss.

Electrical power is consumed in every memory access, reading the first data twice results in larger electrical power consumption.

There is a technique which devises an arrangement of the payload data and the ECC on the memory according to a characteristic of the memory in realizing the vertical ECC, so as to access the payload data and the ECC at high speed (for example, Patent Literature 1).

CITATION LIST

Patent Literature

Patent Literature 1: JPH11-098462

SUMMARY OF INVENTION

Technical Problem

In the method of Patent Literature 1, a vertical ECC and DRAM high speed access technology of a page mode and a switching of a bank are enabled, but only applicable to an incremental access and not for a wrapping read access.

The present invention is conceived in light of such circumstances described above. The present invention mainly aims to avoid redundant read out of data, to efficiently use limited memory area, and to restrain electrical power consumption in memory access.

Solution to Problem

A read request processing apparatus according to the present invention is a read request processing apparatus for processing a read request that requests read out of payload data from a memory which has n number of addresses each for storing data of a predetermined data width, the n number of addresses being sectioned at every m number of addresses (m is an integer of 2 or greater, and n is an integer being an integer multiple of m by an integer of 2 or greater) which is a unit of wrapping read, payload data and error correction data which are correlated with each other being stored across two adjacent addresses, and data being read out according to a unit of address.

The read request processing apparatus includes:

a read request input unit that inputs the read request;

a read request determination unit that determines whether or not the read request inputted by the read request input unit is a request of a wrapping read;

an address extraction unit that, when the read request is determined to be the request of the wrapping read by the read request determination unit, extracts as a wrapping read target the m number of addresses including the address where the payload data requested by the read request is stored from the n number of addresses, designates a read out order of data from the m number of addresses based on an order in the m number of addresses extracted, limits a number of times of read out of data from each address to once;

a leading data storage unit that, when the read request is determined to be the request of the wrapping read by the read request determination unit, and data is read out from a leading address to which a forefront position in the read out order has been designated among the m number of addresses extracted by the address extraction unit, inputs leading data read out from the leading address and stores the leading data; and a data extraction unit that, when the read request is determined to be the request of the wrapping read by the read request determination unit, and data is read out from a trailing address to which an end position in the read out order has been designated among the m number of addresses extracted by the address extraction unit, inputs trailing data read out from the trailing address, inputs the leading data from the leading data storage unit, and extracts the payload data and the error correction data which are correlated with each other from the leading data and the trailing data.

Advantageous Effects of Invention

According to the present invention, the number of times of read out of data from each address is limited to once and the leading data is stored. The leading data stored is used for the trailing data. Therefore, it is possible to avoid redundant reading out of data, to utilize limited memory area efficiently, and to restrain electrical power consumption by memory access.

BRIEF DESCRIPTION OF DRAWINGS

FIG. 1 a diagram showing an example of an arrangement of data without an ECC according to a first embodiment;

FIG. 2 a diagram showing an example of an arrangement of data with a vertical ECC added according to the first embodiment;

DESCRIPTION OF EMBODIMENTS

Embodiment 1

Figure 3:
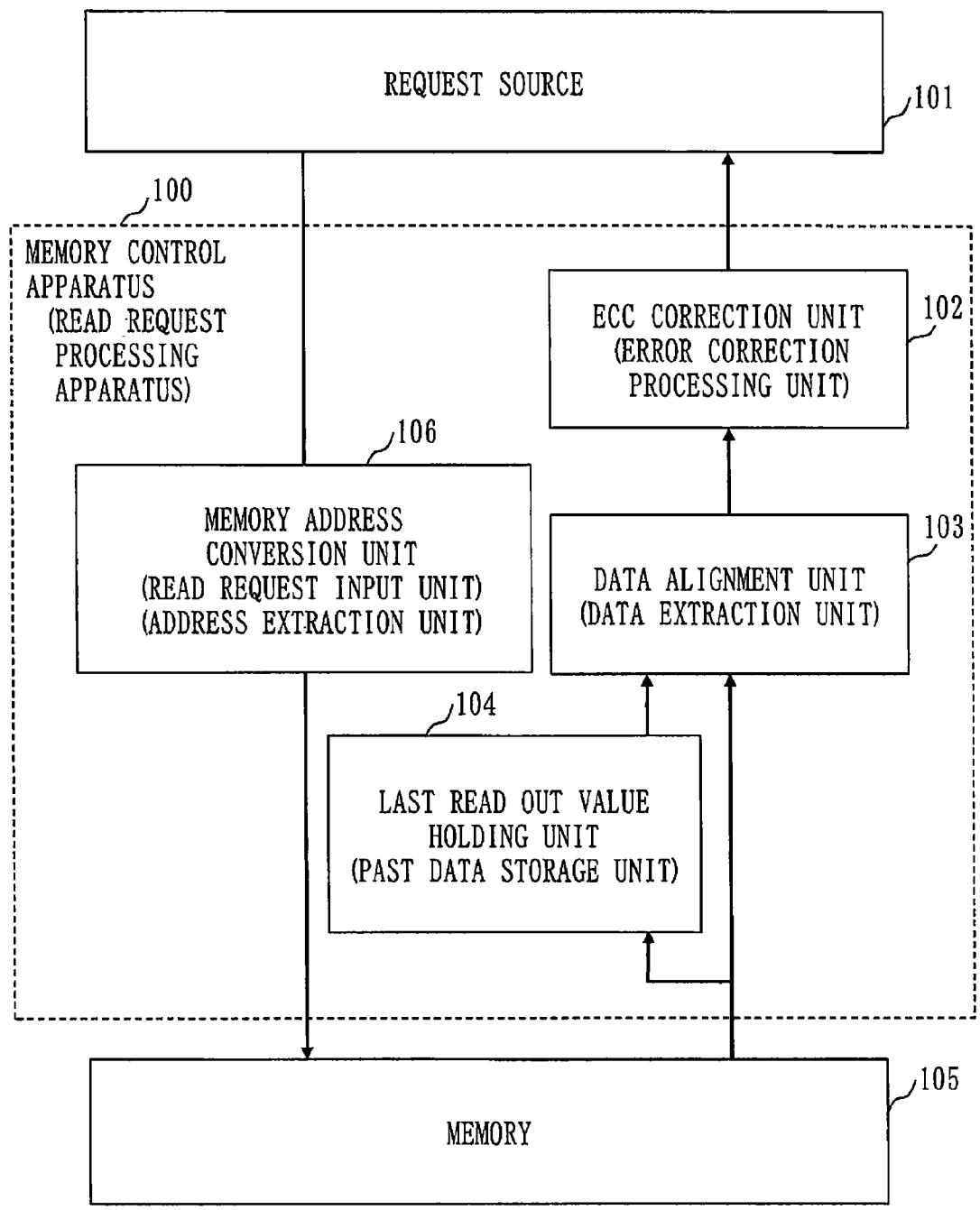
FIG. 3 a diagram showing a memory control apparatus, a request source, and a memory according to the first embodiment.

FIG. 3 shows a memory control apparatus 100, a request source 101, and a memory 105 according to Embodiment 1.

The present embodiment explains a configuration that is to be a prerequisite for explaining a configuration corresponding to a wrapping read.

The configuration corresponding to the wrapping read will be explained in Embodiment 2.

In FIG. 3, the request source 101 issues a read/write request to the memory 105.

Hereinafter, an explanation will be given limiting only to a case where the request source 101 issues a read request requesting reading out of payload data from the memory 105.

The request source 101 is, for example, a CPU (Central Processing Unit).

The request source 101 recognizes an arrangement of the payload data in a format shown in, for example, FIG. 1.

Further, the request source 101 recognizes a unit of the wrapping read at every four addresses.

In the memory 105, for example, in a format shown in FIG. 2, the payload data and an ECC which is error correction data are arranged.

In the memory 105, an n number of addresses are set.

In FIG. 2, as an example, twenty addresses are set to the memory 105 (n=20).

As previously described, in FIG. 2, one byte of the ECC is added for every four bytes of the payload data according to the vertical ECC.

The vertical ECC, as previously described, is a memory arrangement method of the ECC that arranges the ECC in the depth direction of the address and that implements the ECC or parity without increasing data width of the memory.

From the memory 105, reading out of data in units of addresses is performed.

Further, n number of addresses of the memory 105 is sectioned at every m number of addresses, each being a unit of the wrapping read (in is an integer of 2 or greater, and n is an integer being an integer multiple of m by 2 or greater).

In FIG. 2, as the example, the unit of the wrapping read is provided at every five addresses (m=5).

In the unit of the wrapping read of the memory 105 (for example, address 0000h, address 0004h, address 0008h, address 000Ch, address 0010h) and the unit of the wrapping read of the request source 101 (for example, the address 0000h, the address 0004h, the address 0008h, the address 000Ch), same payload data (D0 to Df) are included.

In FIG. 2, ECC is arranged following the payload data, however, the arrangement is an example, and for an arrangement method of the ECC, it is enough to arrange the payload data and the ECC that are correlated with each other across two adjacent addresses.

For example, "EEC0" may be placed before payload data "D0".

Data allotted to the same address is expandable and a data width of the address may be expanded in such a way that D0 to D3, ECC0, D4 to D6 are in the address 0000h, and D7, ECC1, D8 to Db, ECC2, and Dc are in the next address 0008h. This case is allowable because some of the payload data and the ECC remain correlated with each other across two adjacent addresses.

The memory 105 is a memory controlled by the memory control apparatus 100.

The memory control apparatus 100 is configured of a memory address conversion unit 106, a last read out value holding unit 104, a data alignment unit 103, and an ECC correction unit 102.

Each element of the memory control apparatus 100 is, for example, hardware such as a component, a device, and a circuit.

Each element of the memory control apparatus 100 is, for example, semiconductor circuits in a chipset.

For example, the memory address conversion unit 106, the data alignment unit 103, and the ECC correction unit 102 may be implemented using a program.

The memory control apparatus 100 corresponds to an example of a read request processing apparatus.

The memory address conversion unit 106 receives a read request from the request source 101.

The memory address conversion unit 106 converts an address of the read request received to an address on the memory 105 where the vertical ECC is arranged.

In other words, the memory address conversion unit 106 extracts as a read out target, payload data requested by the read request from the request source 101, and p number (p is an integer of 2 or greater and less than or equal to n) of addresses where the ECC which correlates with the payload data is stored.

The memory address conversion unit 106 corresponds to an example of a read request input unit and an address extraction unit.

The last read out value holding unit 104 is a register that holds last read data (4 bytes) received from the memory 105.

In other words, every time 4 byte-data is read out from each address designated by the memory address conversion unit 106, the last read out value holding unit 104 inputs the 4 byte-data read out, and stores the data inputted as the last read out value (past data).

The last read out value holding unit 104 corresponds to an example of a past data storage unit.

The data alignment unit 103 separates current read data (4 bytes) received from the memory 105 and the data of the last read out value holding unit 104 (4 bytes) into a payload data part and its correlating ECC, and aligns the data into an arrangement that enables ECC correction to be performed.

In other words, every time 4 byte-data is read out from each address designated by the memory address conversion unit 106, the data alignment unit 103 inputs the data of 4 bytes read out.

The data alignment unit 103 inputs from the last read out value holding unit 104 the 4 byte-data (the last read out value) read out immediately before the 4 byte-data inputted, and extracts the payload data and the ECC that are correlated with each other from the data from the memory 105 and the data which is the last read out value.

The data alignment unit 103 corresponds to an example of a data extraction unit.

The ECC correction unit 102 performs the ECC correction on read data received from the data alignment unit 103 and returns the read data to the request source 101.

In other words, the ECC correction unit 102, by using the ECC extracted by the data alignment unit 103, performs error correction on the payload data that are correlated with the ECC, and outputs payload data on which the error correction process has been performed, to the request source 101.

The ECC correction unit 102 corresponds to an example of an error correction processing unit.

Figure 4:
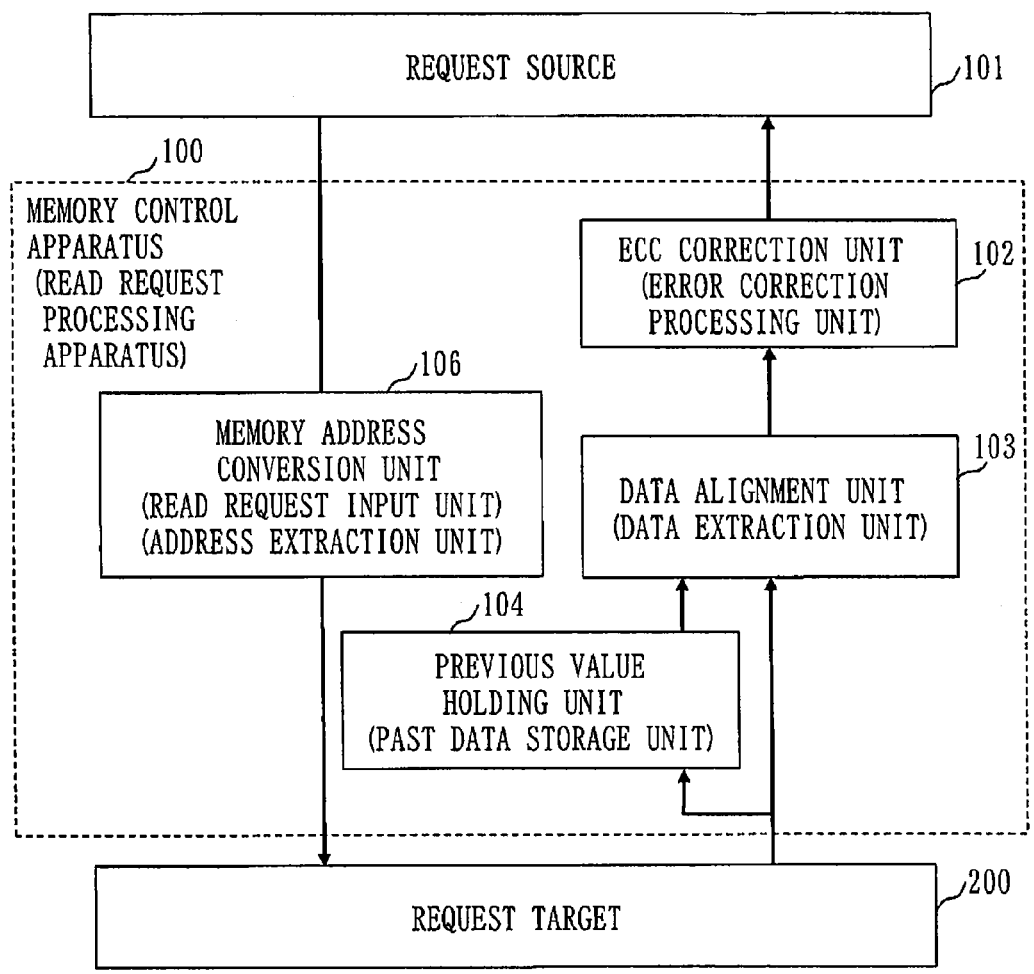
FIG. 4 a diagram showing the memory control apparatus, the request source, and a request target according to the first embodiment.

In FIG. 3, a configuration of the memory control apparatus 100 being directly connected to the memory 105 is shown, however, as shown in FIG. 4, the memory control apparatus 100 may be connected to a request target 200.

Although not shown in FIG. 4, the request target 200 is connected to the memory 105, reads out the data from the memory 105, and outputs the data read out to the memory control apparatus 100.

Figure 5:
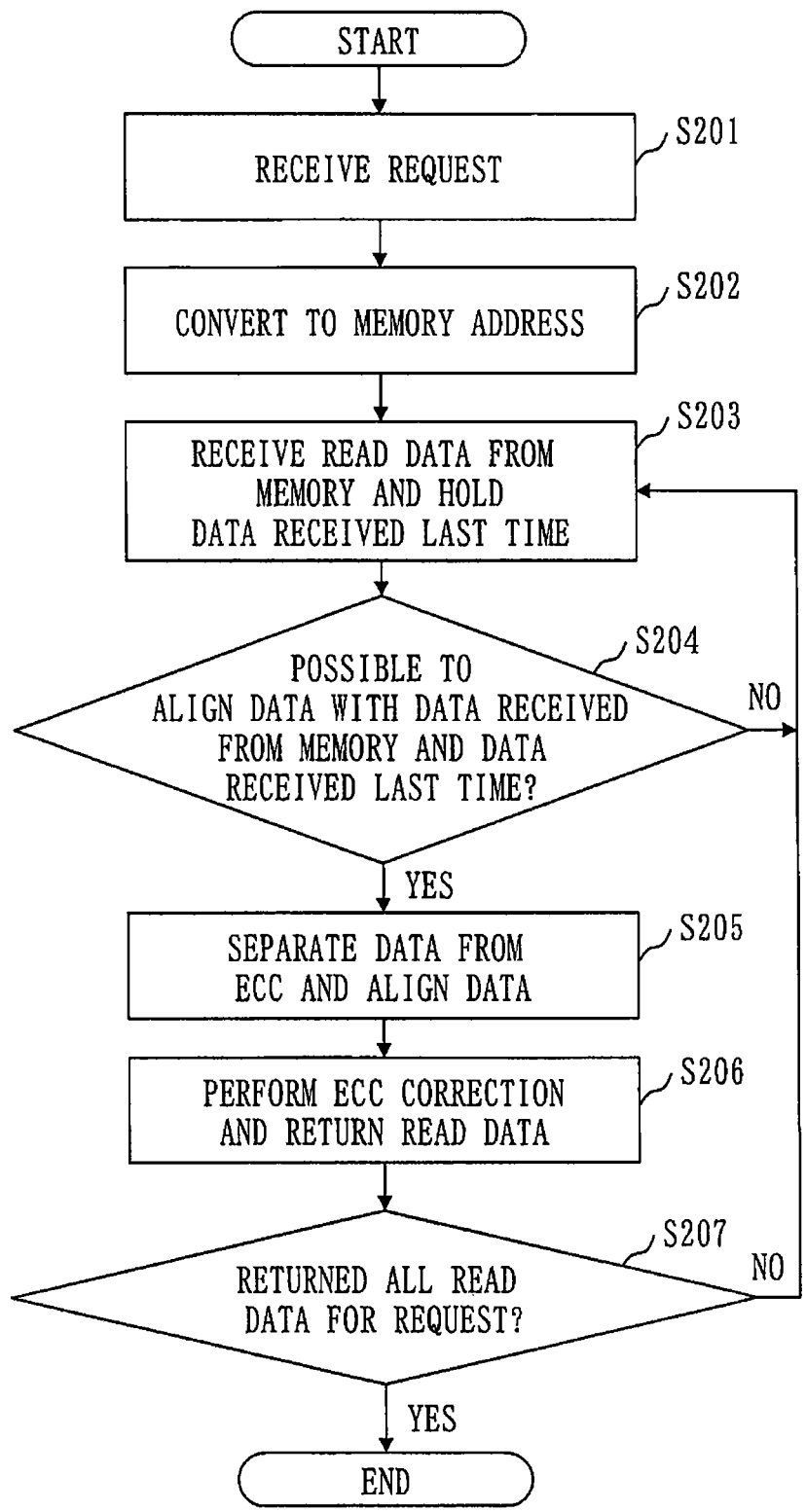
FIG. 5 a flowchart showing an example of an operation of the memory control apparatus according to the first embodiment.

Next, an example of an operation of the memory control apparatus 100 according to the present embodiment will be explained referring to FIG. 5.

Here, a case where the request source 101 requests read of 4 bytes (D0 to D3) of the address 0000h of FIG. 1 will be explained.

First, the memory address conversion unit 106 receives a read request from the request source 101 (S201).

The memory address conversion unit 106 calculates an area on the memory 105 that includes the 4 byte-data (D0 to D3) and corresponding ECC (ECC0).

Referring to FIG. 2, since the above data is arranged in the address 0000h and 0004h, the memory address conversion unit 106 converts the request to a request for reading 8 bytes from the address 0000h (S202).

Then, the memory address conversion unit 106 instructs the memory 105 to read out data of the address 0000h (D0 to D3) and then data of the address 0004h (ECC0 to D6).

The memory 105 sequentially returns the data of the address 0000h (D0 to D3) and the data of the address 0004h (ECC0 to D6).

The last read out value holding unit 104 receives the data of the address 0000h (D0 to D3), and holds the data of the address 0000h (D0 to D3) received (S203).

The data alignment unit 103 also receives the data of the address 0000h (D0 to D3), but since data alignment is not possible with only the data of the address 0000h (NO at S204), the data alignment unit 103 waits for reception of the data of the address 0004h.

The data alignment unit 103, after receiving the data of the address 0004h (ECC0 to D6) from the memory 105, determines data alignment is possible with the data of the address 0000h (D0 to D3) that the last read out value holding unit 104 holds, and the data of the address 0004h (ECC0 to D6) received from the memory 105 (YES at S204).

In other words, the data alignment unit 103 determines that the payload data (D0 to D3) and the ECC (ECC0) that are correlated with each other can be extracted from the data of the address 0000h (D0 to D3) and the data of the address 0004h (ECC0 to D6).

Next, the data alignment unit 103 cuts out the payload data part D0 to D3 and corresponding ECC0, and aligns the data (S205).

The ECC correction unit 102 receives the data in which the payload data and the ECC are aligned (D0 to D3 and ECC0), and after performing the ECC correction, returns the read data (D0 to D3) to the request source 101 (S206).

Here, since all of the data requested by the read request are returned, the process is complete (S207).

In the above example, a case of reading 4 bytes of the data from the address 0000h has been explained. However, for the read access of simply increasing the address such as read of 8 bytes from the address 0004h, the memory processing apparatus 100 can appropriately return the read data on which the ECC correction process has been performed according to the operation shown in FIG. 5.

As the above, in the present embodiment, a memory control apparatus including the following means has been explained.

(a) a means to convert a request from a request source to a request of a memory and to transfer data;

(b) a means to perform ECC error correction of data;

(c) a means to rearrange data received from a memory that uses a vertical ECC to data enables the ECC error correction (data and corresponding ECC separated);

(d) a means to convert an address and length from the request source into an address and a length of the memory that uses the vertical ECC; and (e) a means to hold last data received from the memory.

The present embodiment has further explained a memory control apparatus including a means to convert a request from a request source to a request to a subsequent request target.

Embodiment 2

In the present embodiment, a configuration to avoid read of first data twice when the wrapping read is performed on the memory that uses the vertical ECC will be explained.

More specifically, a memory control apparatus 100 according to the present embodiment includes a buffer to hold the first data, and completes the read of the first data in one read.

By the memory control apparatus 100 according to the present embodiment, limited memory area can be efficiently used and electrical power consumption by memory access can be restrained.

Furthermore, the memory control apparatus 100 according to the present embodiment can contribute to high speed memory access.

Here, a reason why the read of the first data occurs twice in the wrapping read on the memory that uses the vertical ECC will be explained again.

For example, when wrapping read 16 bytes from the address 0004h of FIG. 1, the memory control apparatus 100 returns to the request source 101 in total, 16 byte-read data in an order of address 0004h→0008h→000Ch→0000h.

When performing this read operation in the memory arrangement with the vertical ECC added as shown in FIG. 2, in total, 24 byte-read data is read from the memory in an order of address 0004h→0008h→000Ch→0010h→0000h→0004h, and the read of the address 0004h occurs twice.

In other words, in the memory arrangement of FIG. 2, the "ECC0" which is the ECC of the payload data "D0 to D3" of the address 0000h, needs to be read from the address 0004h, and therefore the first data (the data of the address 0004h) needs to be read out again.

Figure 6:
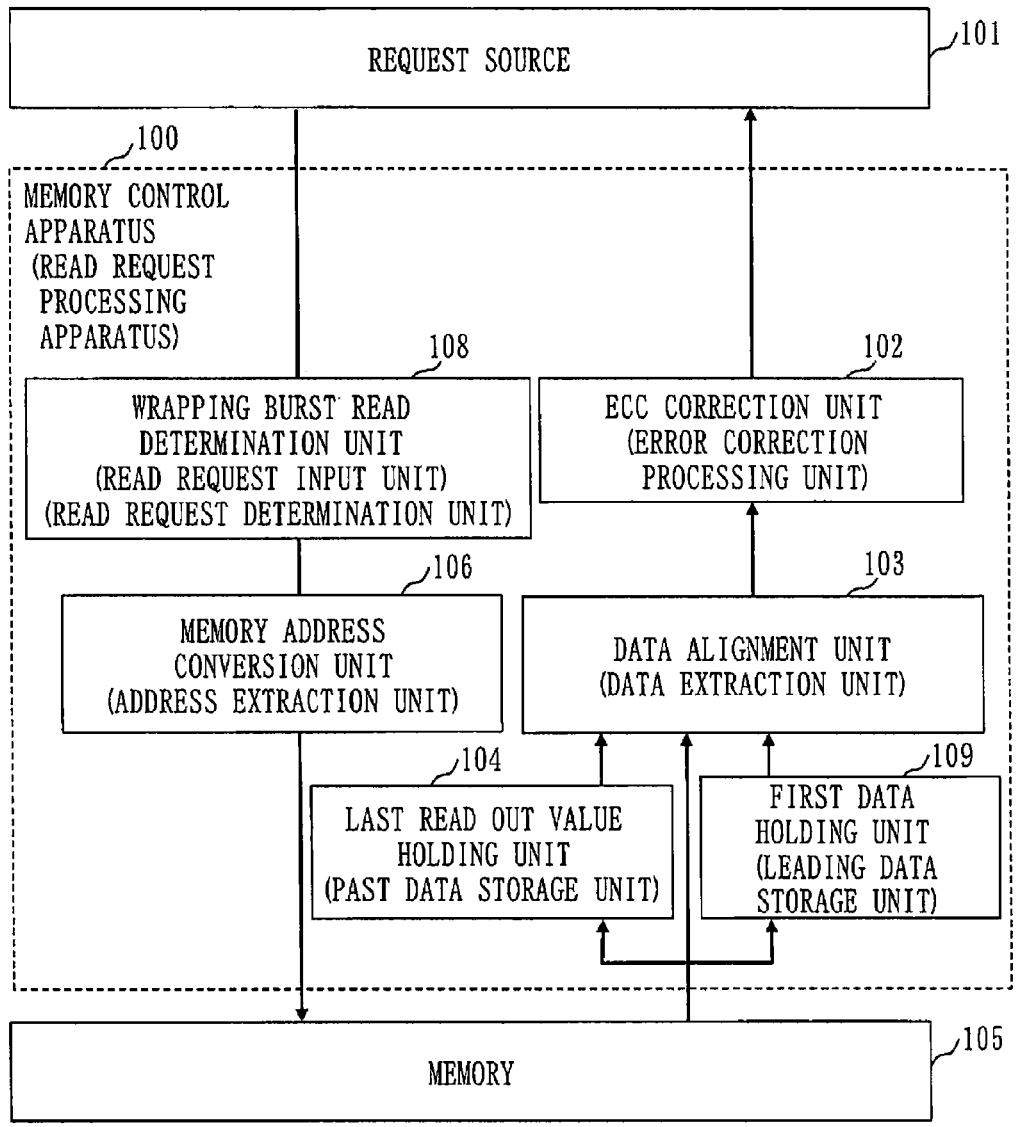
FIG. 6 a diagram showing a memory control apparatus, a request source, and a memory according to a second embodiment.

The memory control apparatus 100 that solves a problem above in the wrapping read will be shown in FIG. 6.

In the memory control apparatus 100 of FIG. 6, a wrapping burst read determination unit 108 and a first data holding unit 109 are added to the configuration shown in FIG. 3.

The wrapping burst read determination unit 108 receives a read request from the request source 101, determines whether the read request received is a read request of a wrapping burst, and notifies the memory address conversion unit 106 of the result.

The wrapping burst read determination unit 108 correspond to an example of the read request input unit and a read request determination unit.

The first data holding unit 109 is a register that holds read data that first returned from the memory 105 by the request converted by the memory address conversion unit 106.

In other words, when the read request is determined by the wrapping burst read determination unit 108 to be the read request of the wrapping burst and data is read out from a leading address (the address 0004h in the example above) which is a forefront position in the read out order, the first data holding unit 109 inputs leading data read out from the leading address and stores the leading data.

The first data holding unit 109 corresponds to an example of a leading data storage unit.

In the present embodiment, when the read request is determined by the wrapping burst read determination unit 108 to be the read request of the wrapping burst, the memory address conversion unit 106 extracts five addresses that includes an address in which the payload data being requested by the read request is stored as an object of the wrapping read.

The memory address conversion unit 106 designates a read out order of data from the five addresses based on an order in the five addresses extracted, and limits the number of times of data read out from each address to once.

For example, suppose that a read request of the wrapping read with the leading address of 0004h (D4 to D7) of FIG. 1 is issued.

The memory address conversion unit 106, as in FIG. 2, extracts the five addresses including the address 0004h and the address 0008h that include payload data "D4 to D7" (the address 0004h, the address 0008h, the address 000Ch, the address 0000h) as an object for the wrapping read.

The memory address conversion unit 106 designates a data read out order as 0004h→0008h→000Ch→0010h.

As described, since the memory address conversion unit 106 of the present embodiment limits the number of times of data read out from each address to once, the data of the address 0004h, which is the first data, is not read out twice.

An operation of the memory address conversion unit 106, when a regular read request is received, is as shown in Embodiment 1.

Since operations of other components shown in FIG. 6 are as explained in Embodiment 1, an explanation will be omitted.

Figure 7:
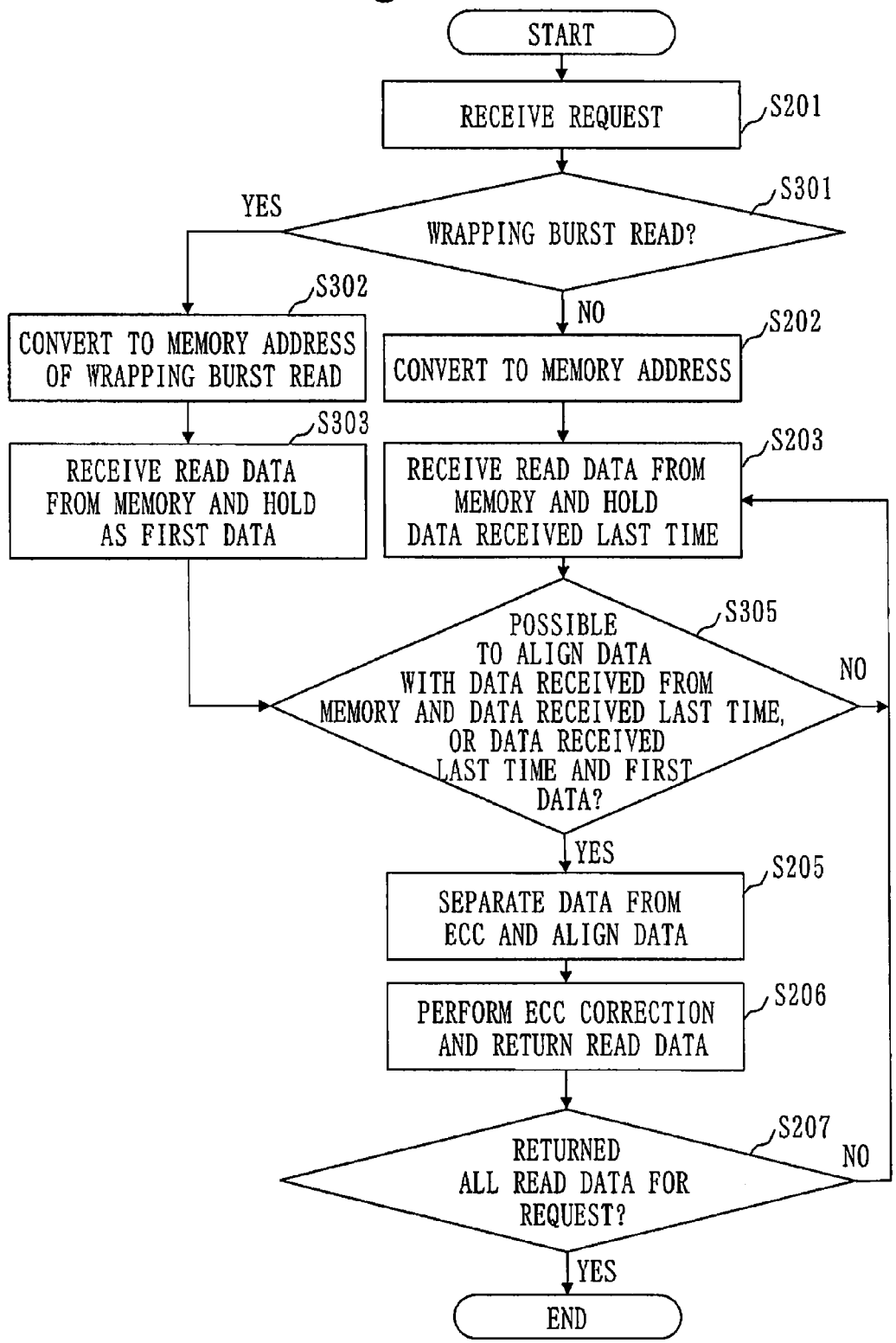
FIG. 7 a flowchart showing an example of an operation of the memory control apparatus according to the second embodiment.

Next, an example of the operation of the memory control apparatus 100 according to the present embodiment will be explained referring to FIG. 7.

Here, a case where the request source 101 requests the wrapping read with the leading address of 0004h (D4 to D7) of FIG. 1 will be explained.

Figure 8:
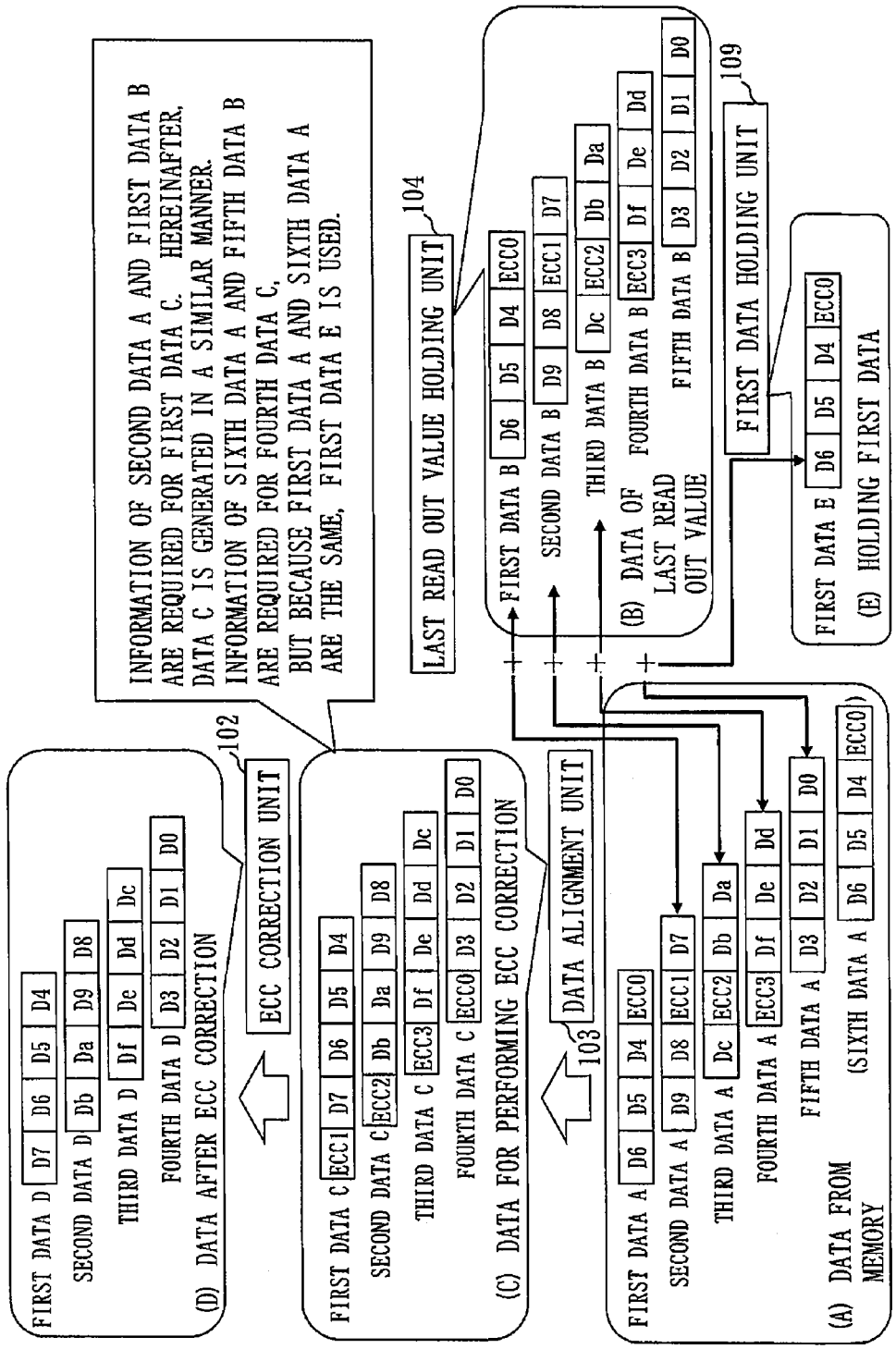
FIG. 8 a diagram showing an example of an operation of the memory control apparatus according to the second embodiment.

FIG. 8 explains how each part of the memory control apparatus 100 processes the data.

First, the wrapping burst read determination unit 108 receives the read request from the request source 101 (S201).

The wrapping burst read determination unit 108 determines whether or not the read request is the request of a wrapping burst read (S301).

If the request is the request of the wrapping burst read (YES at S301), the wrapping burst read determination unit 108 outputs the read request to the memory address conversion unit 106, and the memory address conversion unit 106 converts the request to a memory address of the wrapping burst read (S302).

The memory address conversion unit 106 calculates an area which includes 16 byte-data (D4 to Df and D0 to D3) and its corresponding ECC (ECC1 to ECC3 and ECC0).

Referring to FIG. 2, the above data is arranged from the address 0004h to the address 0010h, and at the address 0000h, and therefore the request is converted to a request for reading 16 bytes from the address 0004h and 4 bytes from the address 0000h (S302).

The memory address conversion unit 106 instructs the memory 105 to read out data in an order of 0004h→0008h→000Ch→0010h.

The memory 105 returns the data sequentially starting from the data of the address 0004h (ECC0 to D6).

The first data holding unit 109 receives data of the address 0004h (ECC0 to D6) which is the leading data (First data A of FIG. 8), and holds the data of the address 0004h received as first data (First data E of FIG. 8) (S303).

The data alignment unit 103 also receives the data of the address 0004h (ECC0 to D6) (the First data A of FIG. 8), but alignment of data cannot be done with only the data of the address 0004h (NO at S305), therefore, the data alignment unit 103 waits for data reception of the address 0008h.

At the same time, the last read out value holding unit 104 also receives the data of the address 0004h (ECC0 to D6) (the First data A of FIG. 8), and holds the data of the address 0004h received as the last read out value (First data B of FIG. 8) (S203).

The operation until receiving data of the address 0000h is the same as the operation of Embodiment 1.

That is, when the data of the address 0008h (D7 to D9) (Second data A of FIG. 8) is read out from the memory 105, the last read out value holding unit 104 holds the data of the address 0008h as the last read out value (Second data B of FIG. 8) (S203), and the data alignment unit 103 also receives the data of the address 0008h (D7 to D9) (the Second data A of FIG. 8).

The data alignment unit 103, as shown in FIG. 8, extracts "D4 to D7" and "ECC1" from the data of the address 0008h received (Second data A) and the last read out value (First data B), and generates First data C (S305, S205).

Then, the ECC correction unit 102 performs the ECC correction and sends First data D to the request source 101 (S206).

At this point, since not all of the read data is returned, it becomes NO at S207.

Next, when data of the address 000Ch (Da to Dc) (Third data A of FIG. 8) is read out from the memory 105, the last read out value holding unit 104 holds the data of the address 000Ch as the last read out value (Third data B of FIG. 8) (S203), and the data alignment unit 103 also receives the data of the address 000Ch (Da to Dc) (Third data A of FIG. 8).

The data alignment unit 103, as shown in FIG. 8, extracts "D8 to Db" and "ECC2" from the data of the address 000Ch (Third data A) received and the last read out value (Second data B), and generates Second data C (S305, S205).

Then, the ECC correction unit 102 performs the ECC correction and sends Second data D to the request source 101 (S206).

At this point, since not all of the read data is returned, it becomes NO at S207.

Next, when data of the address 0010h (Dd to ECC3) (Fourth data A of FIG. 8) is read out from the memory 105, the last read out value holding unit 104 holds the data of the address 0010h as the last read out value (Fourth data B of FIG. 8) (S203), and the data alignment unit 103 also receives the data of the address 0010h (Dd to ECC3) (the Fourth data A of FIG. 8).

The data alignment unit 103, as shown in FIG. 8, extracts "Dc to Df" and "ECC3" from the data of the address 0010h (the Fourth data A) received and the last read out value (Third data B) received, and generates Third data C (S305, S205).

Then, the ECC correction unit 102 performs the ECC correction and sends Third data D to the request source 101 (S206).

At this point, since not all of the read data is returned, it becomes NO at S207.

Next, when data of the address 0000h (D0 to D3) (Fifth data A of FIG. 8) is read out from the memory 105, the last read out value holding unit 104 holds the data of the address 0000h as the last read out value (Fifth data B of FIG. 8) (S203), and the data alignment unit 103 also receives the data of the address 0000h (D0 to D3) (the Fifth data A of FIG. 8).

The data alignment unit 103 receives the data of the address 0000h (D0 to D3) (the Fifth data A of FIG. 8), but data alignment cannot be done with the data of the address 0010h (Fourth data B) (NO at S305), therefore, the data alignment unit 103 waits for the data of the address 0000h (Fifth data B).

The data alignment unit 103, as shown in FIG. 8, extracts "D0 to D3" and "ECC0" from the data of the address 0000h (the Fifth data B) received and the first data in the first data holding unit 109 (First data E), and generates Fourth data C (S305, S205).

Then, the ECC correction unit 102 performs the ECC correction and sends Fourth data D to the request source 101 (S206).

At this point, since all of the read data is returned, it becomes YES at S207.

In the example above, the last read out value holding unit 104 stores the Fourth data B and the Fifth data B, but the Fourth data B and the Fifth data B are not used in the data alignment unit 103. Therefore, the last read out value holding unit 104 need not store the Fourth data B and the Fifth data B.

As described, according to the present embodiment, a number of times of data read out from each address is limited to once and the first data is stored, and the first data being stored is used for trailing data, thus redundant read out of data can be avoided, limited memory area can be used efficiently, and electrical power consumption by memory access can be restrained.

As stated above, in the present embodiment, in addition to the configuration shown in Embodiment 1, a memory control apparatus including the following means has been explained:

(a) a means to hold first received data by a request from a request source; and (b) a means to determine a wrapping read.

Embodiment 3

In Embodiment 1, until a read request from the request source 101 is accepted and returning of its read data is completed, a next read request cannot be accepted.

For example, in DRAM, an interval between issuance of a read request and returning of read data (read latency) is long, but a next read request can be issued continuously before the return of the read data for which the read request is issued.

This pipeline process is necessary to improve throughput.

Figure 9:
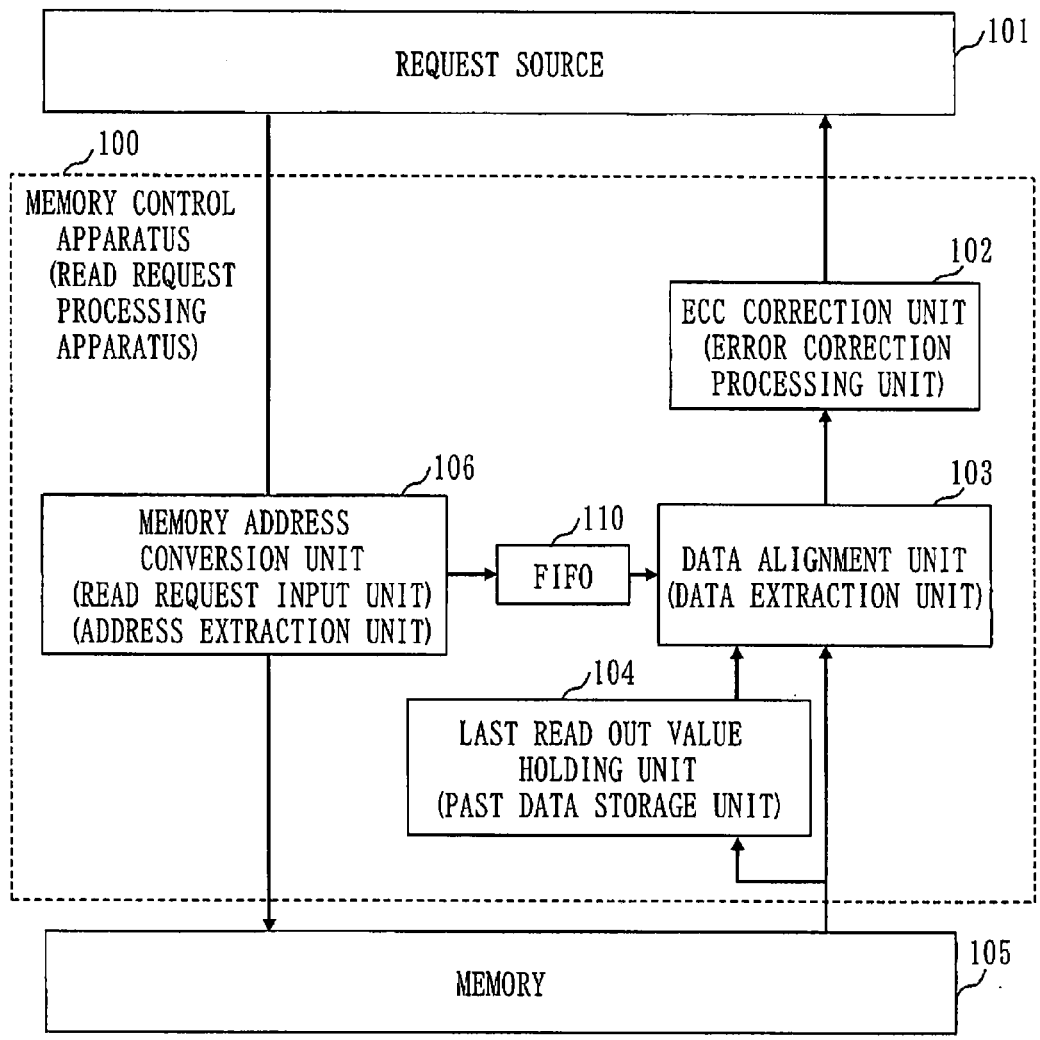
FIG. 9 a diagram showing a memory control apparatus, a request source, and a memory according to a third embodiment.

Based on the configuration of Embodiment 1, the memory control apparatus 100 that performs the pipeline process is shown in FIG. 9.

In the memory control apparatus 100 shown in FIG. 9, a FIFO (First-In First-Out) 110 is added to the configuration shown in FIG. 3.

The FIFO 110 stores the request issued for the memory 105, and provides the information of the request to the data alignment unit 103 at a time when the read data is returned from the memory 105.

Since operations of other components shown in FIG. 9 are as explained in Embodiment 1, explanation will be omitted.

Figure 10:
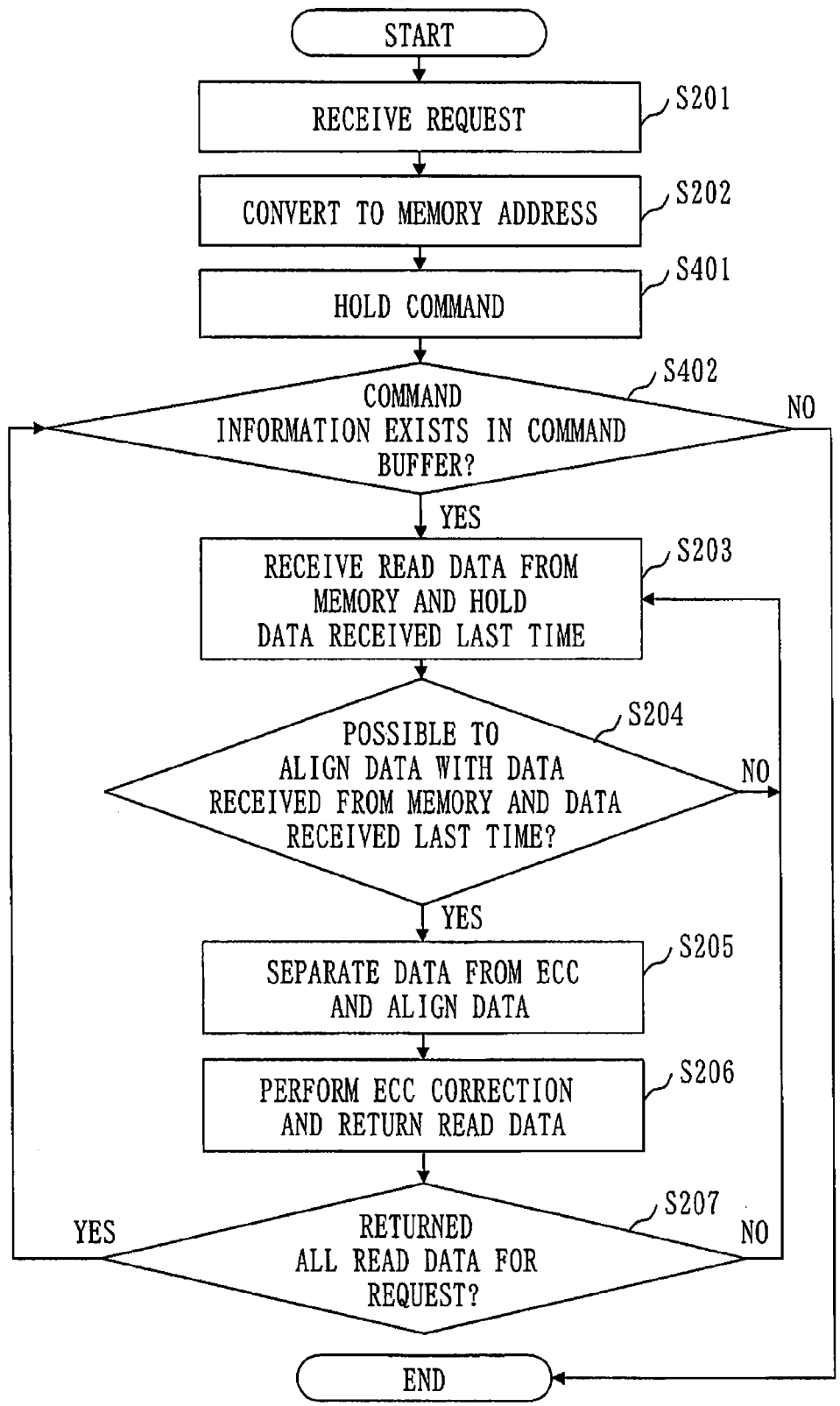
FIG. 10 a flowchart showing an example of an operation of the memory control apparatus according to the third embodiment.

Next, an example of operation of the memory control apparatus 100 of the present embodiment will be explained referring to FIG. 10.

The processes up to the process in which the memory address conversion unit 106 converts the address requested by the read request into a memory address of FIG. 2 (S202) are the same as those in Embodiment 1.

Next, command information converted into the memory address is held in the FIFO 110 (S401).

When accepting a new request read from the request source 101 before completing the returning of the read data on which the ECC correction has been performed, the command information is continuously held in the FIFO 110.

Here, since the command information is held in the FIFO 110 and the FIFO 110 is not empty (YES at S402), the data alignment unit 103 and the last read out value holding unit 104 accepts the read data from the memory 105 (S203).

If the command information exists in the FIFO 110 after completing the returning of the read data on which the ECC correction has been performed (YES at S402), the data alignment unit 103 and the last read out value holding unit 104 accepts read data for a next request from the memory 105 (S203).

If the command information does not exist in the FIFO 110 (NO at S402), returning of all of data of a request is completed and the process ends (S207).

In the present embodiment, in addition to the configuration shown in Embodiment 1, a memory control apparatus that includes a means to store a request from a request source has been explained.

Embodiment 4

With the configuration explained in Embodiment 2, a pipeline process is possible as with Embodiment 3.

However, a simple addition of the FIFO 110 to a configuration shown in FIG. 6 causes an inconvenience.

When memory read is continuously performed by the pipeline process on a read request after a wrapping read, there is a case where data that has been read out for the read request next in line is outputted to the data alignment unit 103 from the memory 105 immediately after data of a trailing address of the wrapping read is outputted from the memory 105.

In the wrapping read, after the data of the trailing address is outputted to the data alignment unit 103 from the memory 105, data alignment is performed by the data alignment unit 103 using the first data from the first data holding unit 109 and data of the trailing address stored in the last read out value holding unit 104.

Before the data alignment is completed, when the data read out for a next read request from the memory 105 is inputted to the data alignment unit 103, collision of data occurs in the data alignment unit 103.

For this reason, in the present embodiment, the FIFO 110 and a means to control data collision are provided in the configuration shown in FIG. 6, thereby the pipeline process is implemented.

Figure 11:
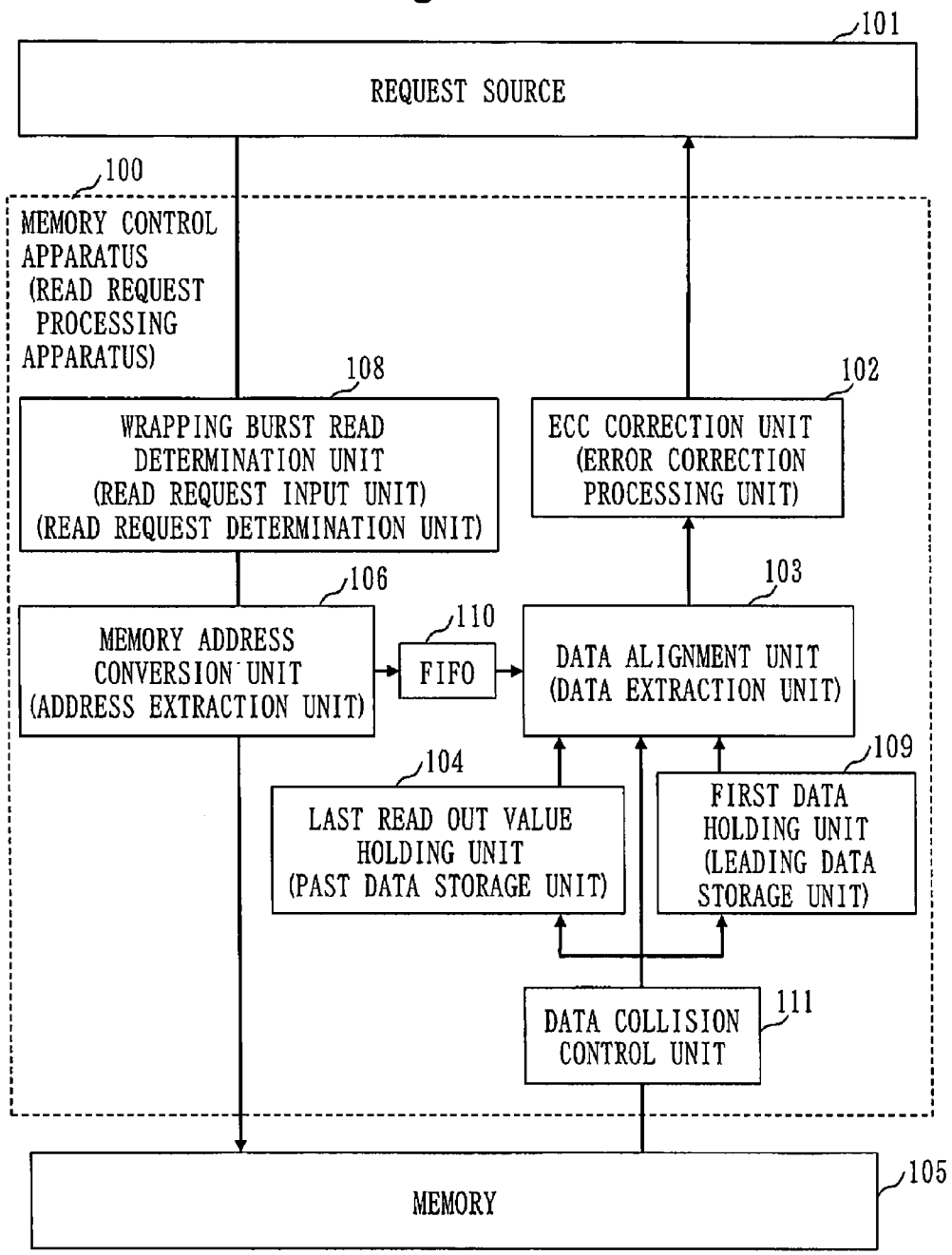
FIG. 11 a diagram showing a memory control apparatus, a request source, and a memory according to a fourth embodiment.

Based on the configuration of Embodiment 2, the memory control apparatus 100 which performs the pipeline process will be shown in FIG. 11.

In the memory control apparatus 100 shown in FIG. 9, the FIFO 110 and a data collision control unit 111 is added to the configuration shown in FIG. 6.

The data collision control unit 111, at a timing of the data alignment unit 103 using the first data from the first data holding unit 109, attempts to prevent the data read out from the memory 105 for a subsequent read request from being inputted to the data alignment unit 103.

In other words, the data collision control unit 111 performs timing control on data read out from the memory 105 so that the data read out for the subsequent read request from the memory 105 can be inputted into the data alignment unit 103 after the data alignment unit 103 inputs the first data from the first data holding unit 109 and extracts the payload data and the ECC that are correlated with each other from the first data and the data of the trailing address.

For example, as shown in FIG. 11, it is assumed that arranging the data collision control unit 111 between the memory 105 and the data alignment unit 103, the data collision control unit 111 performs collision control by buffering the data read out from the memory 105 for the subsequent read request.

Figure 13:
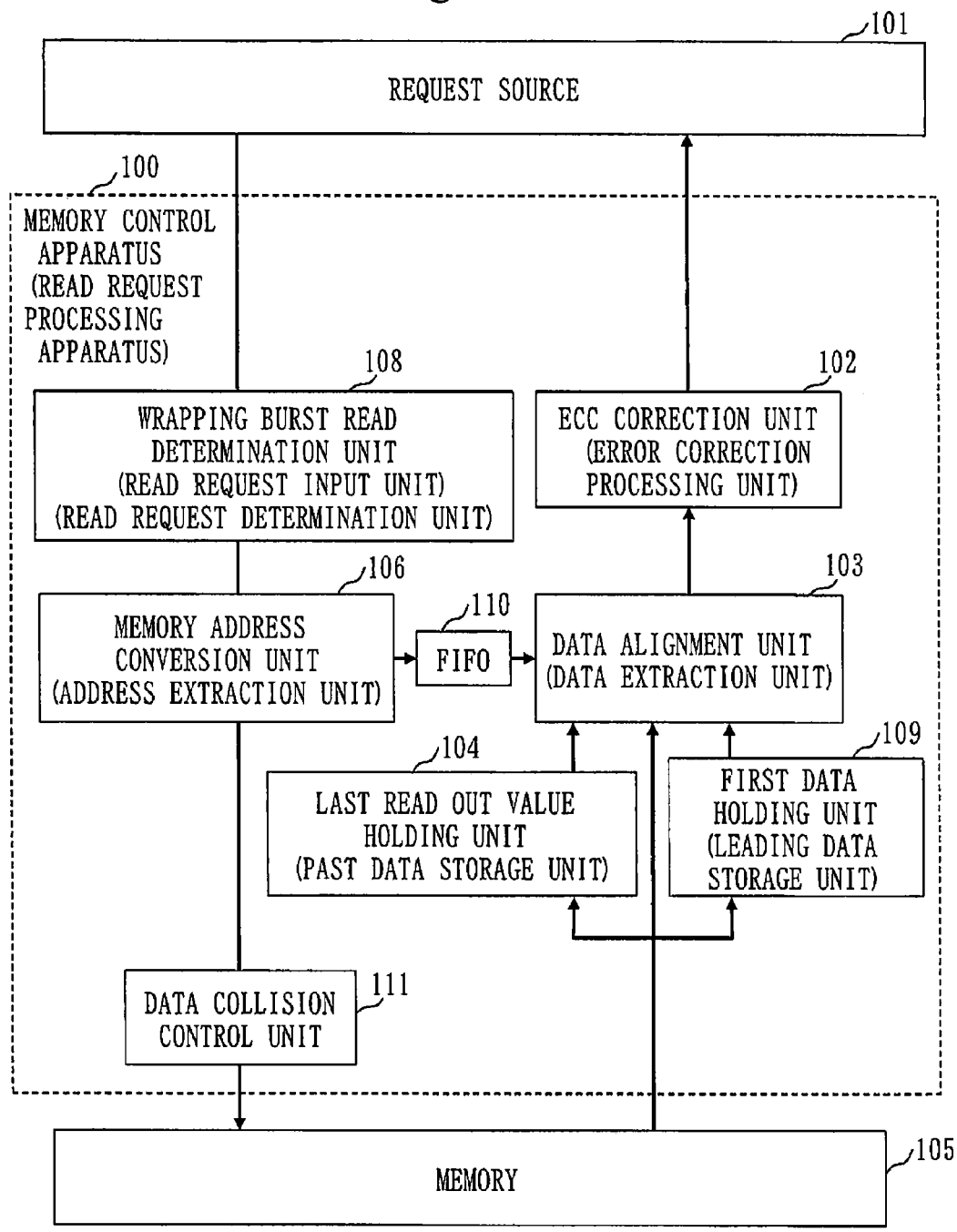
FIG. 13 a diagram showing the memory control apparatus, the request source, and the memory according to the fourth embodiment.

Further, as shown in FIG. 13, it is assumed that arranging the data collision control unit 111 between the memory 105 and the memory address conversion unit 106, the data collision control unit 111 performs collision control by creating intervals between issuance of a request to the memory 105 for a read request subsequent to the wrapping read.

Next, an operation example of the memory control apparatus 100 according to the present embodiment will be explained referring to FIG. 12.

Figure 12:
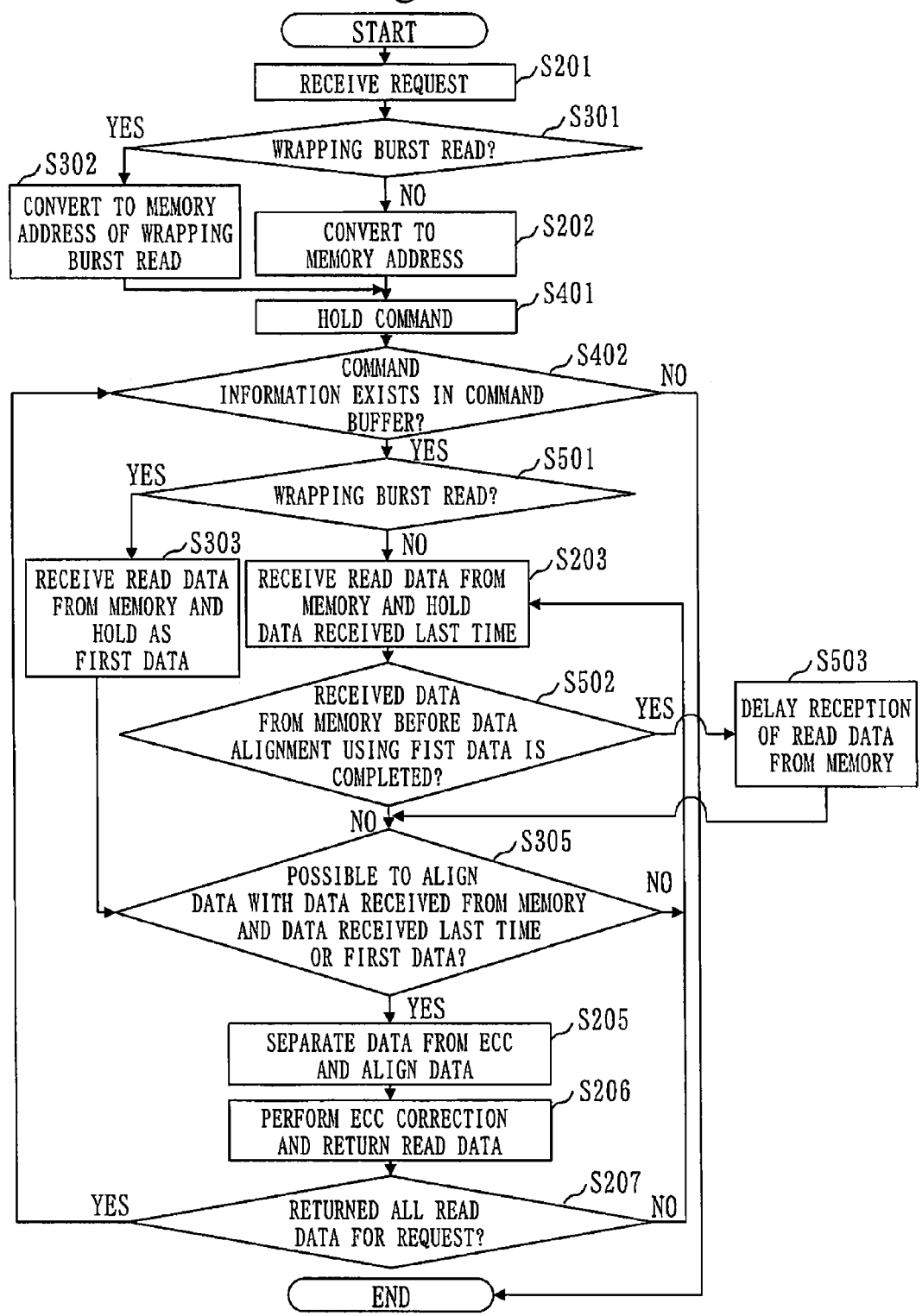
FIG. 12 a flowchart showing an example of an operation of the memory control apparatus according to the fourth embodiment.

FIG. 12 shows an example of an operation of the configuration of FIG. 11.

The process up to the process in which the command information is held in the FIFO 110 (S401) is the same as those in Embodiment 2 and Embodiment 3.

If leading command information held in the FIFO 110 is not command information of the wrapping read (NO at S501), the same process as Embodiment 3 is implemented.

If the leading command information held in the FIFO 110 is the command information of the wrapping read (YES at S501), the processes up to the process in which the data alignment unit 103 performs data alignment using the first data is the same as those in Embodiment 2.

Next, the data collision control unit 111 determines whether or not the data read out from the memory 105 has been received before the data alignment unit 103 completes the data alignment using the first data (S502).

If there has been data reception from the memory 105 before completing the data alignment (YES at S502), the data collision control unit 111 delays timing of the data alignment unit 103 receiving the read data from the memory 105 (S503).

Specifically, the data collision control unit 111 performs buffering of the read data from the memory 105.

The operations thereafter are the same as those in Embodiment 3.

As stated above, in the present embodiment, in addition to the configuration shown in Embodiment 2, a memory control apparatus including the following means has been explained:

(a) a means to store a request from a request source; and (b) a means to implement collision control between first data received described in Embodiment 2 and data received from a memory.

REFERENCE SIGNS LIST

100: memory control apparatus, 101: request source, 102: ECC correction unit; 103: data alignment unit, 104: last read out value holding unit, 105: memory, 106: memory address conversion unit, 108: wrapping burst read determination unit, 109: first data holding unit, 110: FIFO, 111: data collision control unit, 200: request target

The invention claimed is:

1. A read request processing apparatus for processing a read request that requests read out of data, including payload data and error correcting data, from
   a memory which has n number of addresses each for storing the data of a predetermined data width, the n number of addresses being sectioned at every m number of addresses (m is an integer of 2 or greater, and n is an integer being an integer multiple of m by an integer of 2 or greater) which is a unit of a wrapping read, the payload data and the error correction data which are correlated with each other being stored across two adjacent addresses, and the data being read out according to a unit of address,
   the read request processing apparatus comprising:
   a read request input unit that receives the read request;
   a read request determination unit that determines whether or not the read request received by the read request input unit is a request of the wrapping read;
   an address extraction unit that, when the read request is determined to be the request of the wrapping read by the read request determination unit, extracts as a wrapping read target the m number of addresses including an address where the payload data requested by the read request is stored from the n number of addresses, designates a read out order of the data from the m number of addresses based on an order in the m number of addresses extracted, and limits a number of times of read out of the data from each of the m number of addresses to once;
   a leading data storage unit that, when the read request is determined to be the request of the wrapping read by the read request determination unit, and leading data is read out from a leading address to which a forefront position in the read out order has been designated among the m number of addresses extracted by the address extraction unit, receives the leading data read out from the leading address and stores the leading data; and
   a data extraction unit that, when the read request is determined to be the request of the wrapping read by the read request determination unit, and trailing data is read out from a trailing address to which an end position in the read out order has been designated among the m number of addresses extracted by the address extraction unit, receives the trailing data read out from the trailing address, receives the leading data from the leading data storage unit, and extracts the payload data and the error correction data which are correlated with each other from the leading data and the trailing data.

2. The read request processing apparatus according to claim 1 further comprising:
   a past data storage unit that, when the read request is determined to be the request of the wrapping read by the read request determination unit, every time the data is read out from each address of the m number of addresses according to the read out order designated by the address extraction unit, receives the data read out and stores the data received as past data, wherein
   when the read request is determined to be the request of the wrapping read by the read request determination unit, and until the trailing data is read out from the trailing address, every time data is read out from each address of the m number of addresses according to the read out order designated by the address extraction unit, the data extraction unit receives the data read out, receives from the past data storage unit the past data read out immediately before the received data is received, and extracts the payload data and the error correction data which are correlated with each other from the received data and the past data.

3. The read request processing apparatus according to claim 1 further comprising:
   an error correction processing unit that, by using the error correction data extracted by the data extraction unit, performs an error correction process on the payload data which are correlated with the extracted error correction data, and sends the payload data, on which the error correction process has been performed, to a sender of the read request.

4. The read request processing apparatus according to claim 1, wherein
   the address extraction unit, when the read request is determined to be the request of the wrapping read by the read request determination unit, designates the forefront position in the read out order to a request target address which is an address where the payload data requested by the read request is stored, and designates the end position in the read out order to an address immediately before the request target address.

5. The read request processing apparatus according to claim 1, wherein
   the read request determination unit, the address extraction unit, the leading data storage unit, and the data extraction unit perform a pipeline process on a plurality of read requests.

6. The read request processing apparatus according to claim 5 further comprising:
   a data collision control unit that performs timing control on the data read out from the memory so that the data read out from the memory for a read request subsequent to the request of the wrapping read is receive by the data extraction unit after the data extraction unit receives the leading data from the leading data storage unit and the payload data and the error correction data which are correlated with each other are extracted from the leading data and the trailing data.

* * * * *